United States Patent [19]

Fujimoto

[11] Patent Number: 4,571,729

[45] Date of Patent: Feb. 18, 1986

[54] SEMICONDUCTOR LASER HAVING AN INVERTED LAYER IN A PLURALITY OF STEPPED OFFSET PORTIONS

[75] Inventor: Akira Fujimoto, Hirakata, Japan

[73] Assignee: Omron Tateisi Electronics, Co., Kyoto, Japan

[21] Appl. No.: 523,673

[22] Filed: Aug. 16, 1983

Related U.S. Application Data

[63] Continuation-in-part of Ser. No. 505,481, Jun. 17, 1983.

[30] Foreign Application Priority Data

| Jun. 18, 1982 | [JP] | Japan | 57-104774 |
| Jul. 14, 1982 | [JP] | Japan | 57-122774 |
| Jul. 14, 1982 | [JP] | Japan | 57-122775 |
| Jul. 16, 1982 | [JP] | Japan | 57-124253 |
| Aug. 16, 1982 | [JP] | Japan | 57-141807 |

[51] Int. Cl.$^4$ ............................................. H01S 3/19
[52] U.S. Cl. ........................................ 372/46; 357/17; 372/47; 372/50
[58] Field of Search ............... 372/44, 45, 46, 50, 372/47, 43; 357/17

[56] References Cited

U.S. PATENT DOCUMENTS 4,318,059  3/1982  Lang et al. .................. 372/50
4,347,611  8/1982  Seifres et al. ............... 372/45
4,456,999  6/1984  Sugino et al. ............... 372/45

Primary Examiner—James W. Davie
Attorney, Agent, or Firm—Wegner & Bretschneider

[57] ABSTRACT

A semiconductor crystal comprises a plurality of double heterojunction constructions in which layers of semiconductors of the same conductive type are laminated. The plurality of double heterojunction constructions are formed with step differential portion by step portion. In the step differential portion, active layers which constitute a plurality of double heterojunction constructions are laterally formed with PN junction portions which provide laser oscillation. The PN junction portions are formed from an inverted layer in which a conductive body of a second type is diffused over an area on the surface of the semiconductor crystal to the step differential portion. Carrier injection electrodes formed on both surfaces of the semiconductor crystal may either cover the entire surface of both the surfaces of the crystal or be formed as parallel stripes in which carrier injection electrodes on at least one surface side are disposed at required lateral intervals. The plurality of PN junction portions are designed so that a photowave is shifted from one to other between the adjacent PN junction portions, and are set to a state slightly smaller than the laser oscillation threshold value.

5 Claims, 4 Drawing Figures

SEMICONDUCTOR LASER HAVING AN INVERTED LAYER IN A PLURALITY OF STEPPED OFFSET PORTIONS

This application is a continuation-in-part of copending application Ser. No. 505,481 filed June 17, 1983.

FIELD OF THE INVENTION

This invention relates to a semiconductor laser, and particularly to a semiconductor laser formed with PN junction portions which provide, with an inverted diffusion layer, laser oscillation for step differential portion in a plurality of double hetero-junction construction in which layers of semiconductors of the same conductivity type are laminated.

BACKGROUND OF THE INVENTION

In a general semiconductor laser, a stripe construction is added to a semiconductor crystal having a single double-heterojunction construction so that a crystal end surface forms a Fabry-Perot resonance surface.

As is known, one task imposed on this kind of semiconductor laser is to increase output. However, there is the problem of breakdown of the crystal end surface, and it is naturally limited to merely increasing a driving current for the purpose of increasing oscillation output.

In view of the foregoing, it has heretofore been proposed to make a semiconductor laser in which a plurality of stripe constructions is added to form a plurality of light emitting areas in an active layer, and the output is increased by summing the output light from the light emitting areas.

However, in the conventional semiconductor laser as just mentioned, a plurality of masking steps is required, for the addition of stripe constructions, thus making the manufacturing process complicated. Preferably, in this kind of semicondutor laser, the spacing between the light emitting areas is narrow. However, the spacing between the light emitting areas cannot be made less than the spacing limited by the photolithography technique. That is, it is difficult to increase density in the light emitting area.

Also, as is known, in a photoelectric device such as a facsimile transmitter, a photo deflector composed of an electric optical element, a movable mirror and the like combined therewith is used to scan the output light beam of a semiconductor laser.

However, the combination with the photo deflector involves many problems which are hard to solve because of complicated mechanisms. To effectively make use of the advantages of the semiconductor laser in being small and light weight, it has been desired to develop a semiconductor laser in which an element of the semiconductor laser itself has the function of scanning an output light beam.

Finally, a photo-circuit requires a photo-branch element which converts a single light beam into a plurality of light beams. Major conditions required by a photo-branch element of this kind are as follows: First, that light intensity is not to be decreased by the branching. Second, that a suitable number of branch beams has to be obtained. Third, that integration or miniaturization of the photo-branch element and other photocircuit element for the photodeflector is possible.

However, a photo-branch element fulfilling these requirements has not yet been proposed. In view of the possibility of integration or miniaturization, there are the Y-branch type, the directively coupling type, etc., for example. However, in these types, the light intensity is decreased by the branching, and therefore, it is difficult to increase the number of branches.

SUMMARY OF THE INVENTION

It is an object of this invention to provide a semiconductor laser in which a plurality of laser light emitting area is integrated on a single semicondutor crystal with high density to increase output and which can be easily manufactured without complicating and manufacturing process.

In accordance with the present invention, layers of semiconductors can be merely laminated to diffuse an inverted layer thereon to form a plurality of light emitting areas. Thus, a cumbersome masking process is not required and the semiconductor laser can be easily manufactured.

Also, the spacing between the light emitting areas is determined by the thickness of the layers of semiconductors laminated and therefore can be suitably set to be less than the sub-micron range to increase the density of the light emitting areas. Accordingly, it is extremely easy to sum the output beams.

It is a further object of the present invention to provide a semiconductor laser in which a driving current applied to a plurality of laser oscillation areas formed on a single semiconductor crystal is made variable in density distribution thereby to scan a laser output beam with an element of the semiconductor laser itself.

In accordance with the present invention, the carrier density injected into each of a plurality of PN junction portions is high at the PN junction portion near a given carrier injection electrode, and becomes low as one proceeds away from said carrier injection electrode. Thus, if the bias voltage applied to the carrier injection electrode is varied, the threshold value of laser oscillation in the PN junction portion can be controlled in order from the side closer to the electrode, and the laser output beam can be substantially scanned laterally.

If the element itself has the scanning function as described above, a photodeflector as in the prior art need not be provided, and it is possible to secure miniaturization, light weight and high reliability thereby.

It is another object of the present invention to realize, by using a semiconductor laser, a photobranch element which can produce a suitable number of branch beams without deterioration of light intensity.

In accordance with the present invention, when one laser beam is incident on one of a plurality of PN junction portions from the outside of the element, said laser beam is partly propagated to the remaining PN junction portions, and therefore, not only said PN junction portion but the remaining PN junction portions provide laser oscillation by photoexcitation to release a plurality of laser beams. Each branch beam put out at that time has the same phase and the same wavelength as that of the incident laser beam, and the light intensity thereof is amplified. Accordingly, it is extremely simple and easy to increase the number of branches.

Also, a current slightly smaller in value than a threshold current value is pre-supplied to each of PN junction portions to provide laser oscillation by photoexcitation, and therefore, a current smaller in value than the threshold current value when each of PN junction portions individually provides laser oscillation will suffice, thus providing a photobranching semiconductor laser of low power consumption.

Other and further objects of this invention will become obvious upon a reading of the illustrative embodiments described below or set forth in the appended claims, and various advantages not referred to herein will occur to one skilled in the art upon employment of the invention in practice.

DETAILED DESCRIPTION OF THE INVENTION

Figure 1:
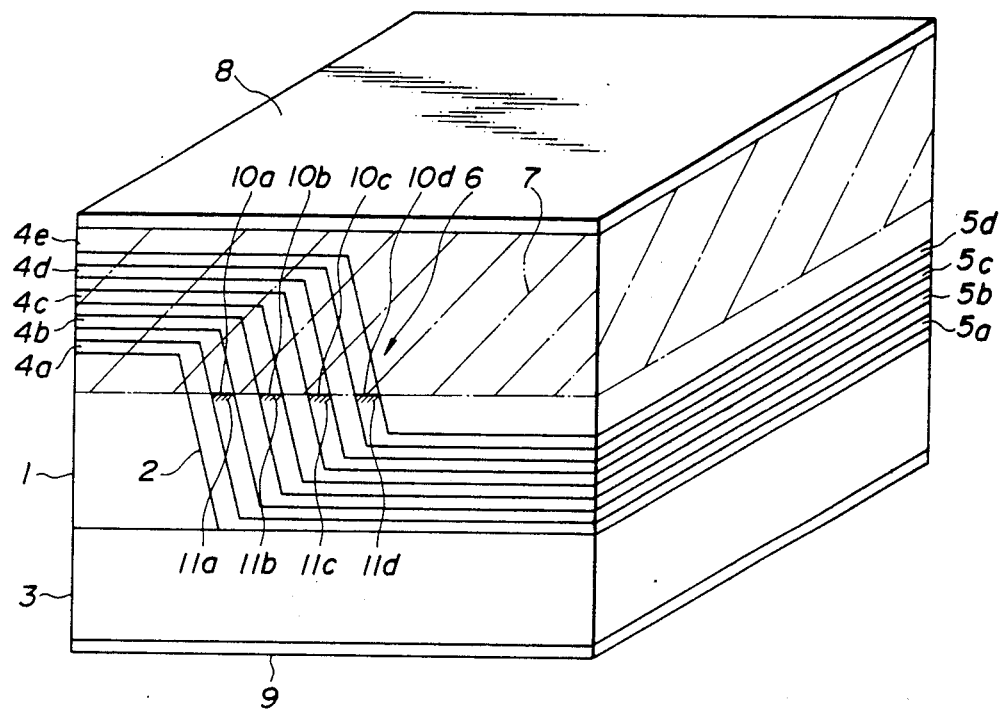
FIG. 1 is a schematic structural view showing a semiconductor laser which can be increased in output.

FIG. 1 shows a semiconductor laser which can be increased in output.

In this semiconductor laser, a semiconductor crystal composed as described hereinafter has both surfaces provided with a positive hole injection electrode 8 and an electron injection electrode 9, respectively.

The aforesaid semiconductor crystal has a semiconductor substrate 3 on which a plurality of semiconductor layers (1, 4a, 4b, 4c, 4d, 4e, 5a, 5b, 5c, 5d) is laminated. After the semiconductor layer 1 has been laminated on the substrate 3, a part thereof is removed by etching to form thereon a step portion 2 comprising a thick portion. That is, the semiconductor layer 1 forms a part of the substrate 3, and the semiconductor layers 4a, 5a, 4b, 5b, 4c, 5c, 4d, 5d and 4e are consecutively laminated on the upper surface of the substrate 3 formed with said step portion 2. Thus, a junction portion of each semiconductor layer is formed with a step differential portion 6 corresponding to said step portion 2. The surface of the final semiconductor layer 4e is approximately flat and horizontal due to the crystal growing rate in the facial direction.

And, the semiconductor layers, 5a, 5b, 5c and 5d are active layers which effect laser operation, and the semiconductor layers 4a, 4b, 4c, 4d and 4e are so-called clad layers which confine carriers and light in the active layers. That is, each set of the semiconductor layers (4a, 5a, 4b), (4b, 5b, 4c), (4c, 5c, 4d) and (4d, 5d, 4e) forms a double heterojunction construction.

The composition of each of the aforementioned semiconductors comprises, in this embodiment, the following. The semiconductor layer 1 comprises GaAlAs, in which an N-type conductive body can be doped or not doped. The substrate 3 and each of the active layers 5a, 5b, 5c and 5d comprise n-GaAs. Each of the semiconductor layers 4a, 4b, 4c, 4d and 4e comprises n-GaAlAs.

The thus constructed semiconductor crystal is formed with an inverted layer 7. This inverted layer 7 is formed by diffusing zinc, which is a P-type conductive body, on an area from the entire surface of the uppermost layer 4e to each of the active layers 5a. 5b, 5c and 5d in the step differential portion 6. As a result, each layer in the step differential portion 6 is formed with a row of PN junction portions in a lateral direction.

Crystal end surfaces on both sides in a longitudinal direction are formed with a Fabry-Perot resonance surface.

In the semiconductor laser constructed as described above, a carrier is injected principally into PN junction portions 10a, 10b, and 10d formed in the active layers 5a, 5b, 5c and 5d, among the PN junction portions formed in the step differential portions 6. This results from the fact that energy gaps of the semiconductor layers 4a, 4b, 4c, 4d and 4e are greater than energy gaps of the active layers 5a, 5b, 5c and 5d. Since both lateral sides of each of the PN junction portions 10a, 10b, 10c and 10d are bounded by the hetero barrier of the semiconductor layers 4a, 4b, 4c and 4e, the injection carrier is confined therein without being laterally diffused and is efficiently re-coupled to generate induced emission light. This induced emission light is confined within each of the active layers (5a, 5b, 5c and 5d). This results from the fact that the refractive index of the active layers 5a, 5b, 5c and 5d is greater than that of the semiconductor layers 4a, 4b, 4c, 4d and 4e. That is, light emitting areas 11a, 11b, 11c and 11d, the lateral widths of which are controlled by a thickness of each active layer and the longitudinal widths of which are equal to the distance between both ends of the crystal, are formed in the PN junction portions 10a, 10b, 10c and 10d of the active layers 5a, 5b, 5c and 5d. In the light emitting areas 11a, 11b, 11c and 11d, induced emission light is repeatedly reflected between the end surfaces of the crystal and is increased in resonance, said light being partly released outside.

That is, the semiconductor laser in accordance with this invention releases a plurality of laser beam. While the spacing of the light emitting areas 11a, 11b, 11c and 11d is determined by a thickness of the semiconductor layers 4a, 4b, 4c and 4d, it is well known that the thickness of the semiconductor layer can be suitably set in the range from a few microns to dozens of microns depending on the growing rate and growing time of crystal. Accordingly, it is extremely easy to take the sum of output beams to provide a semiconductor laser of high output.

In the manufacturing process of said semiconductor laser, no masking process is required to form the inverted layer 7 and the positive hole injection electrode 8, thus simplifying the manufacturing process.

Figure 2:
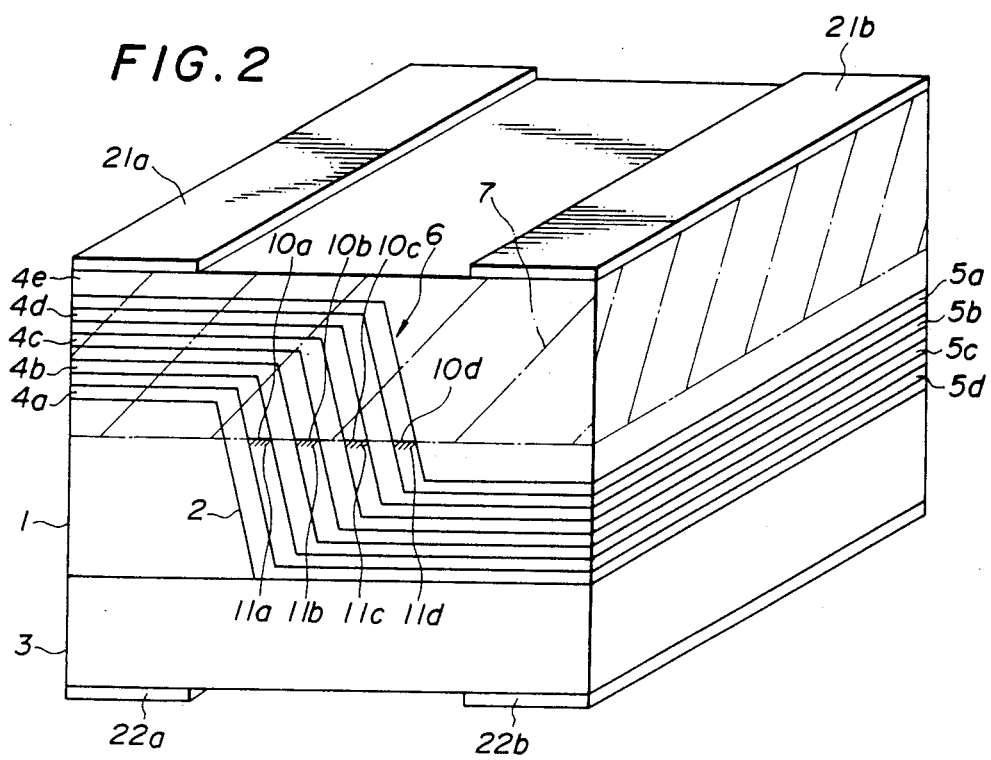
FIG. 2 is a schematic structural view showing a semiconductor laser which can modify the electrode construction in the structure of the semiconductor laser shown in FIG. 1 to scan an output light beam.

FIG. 2 shows a semiconductor laser which can scan an output light beam. This semiconductor laser provides an arrangement in which in the structure of the semiconductor laser shown in FIG. 1, the construction of the carrier injection electrode is modified. Accordingly, those other than the carrier injection electrode are indicated as at the like reference numerals.

That is, positive hole injection electrodes 21a, 21b and electron injection electrodes 22a, 22b are formed as parallel stripes on both lateral sides of the crystal surface, thus not overlapping said step differential portion 6.

In the semiconductor laser constructed as described above, for example, when a forward bias voltage is applied between the electrodes 21a and 22a and a driving current flows, the largest quantity of carriers are injected into the PN junction portion 10a which is shortest in current passage and smallest in electric resistance of passage, the current passage becomes greater in order of the PN junction portions 10b, 10c and 10d to increase electric resistance to passage and the carriers to be injected decrease accordingly. This is, laser oscillation first occurs in the PN junction 10a and as the driving current increases, laser oscillation occurs consecutively in the PN junction portions 10b, 10c and 10d. Then, when a forward bias voltage is applied between the electrodes 21b and 22b and a driving current flows, laser oscillation can be made to occur in order of the PN junction portions 10d, 10c, 10b and 10a, which is the reverse of the above. Also, when a forward bias voltage is applied between the electrodes 21a and 22b or between the electrodes 21b and 22a and a driving current flows, a large quantity of carriers is injected to the PN junction portions 10b, 10c which are short in passage for the same reason as that of the former, laser oscillation first occurs in these junction portions. When the driving current is further increased, laser oscillation occurs also in the PN junction portions 10a and 10d.

By making use of the above-described principle, the driving current flows between the electrodes 21a and 22a to make laser oscillation first occur in the PN junction portion 10a. Subsequently, the driving current between the electrodes 21a and 22a is cut off but the driving current flows between the electrodes 21a and 22b or between the electrodes 21b and 22a to make laser oscillation occur in the PN junction portions 10b and 10c. Finally, the driving current between the electrodes 21a and 22b or between the electrodes 21b and 22a is cut off but the driving current flows between the electrodes 21b and 22b to make laser oscillation occur in the PN junction portion 10d. In this manner, the output beam can be operated laterally between the PN junction portions 10a through 10d. In this case, the output beam is discontinuously moved laterally but the output beam can be moved smoothly by controlling the current value between the electrodes.

While in the above-described embodiment, the carrier injection electrodes are provided on both lateral sides of the crystal surface, without overlapping the step differential portion, it should be noted that the present invention is not limited thereto but for example, at least one carrier injection electrode can be formed into an plurality of electrodes formed as parallel stripes at predetermined lateral intervals.

Figure 3:
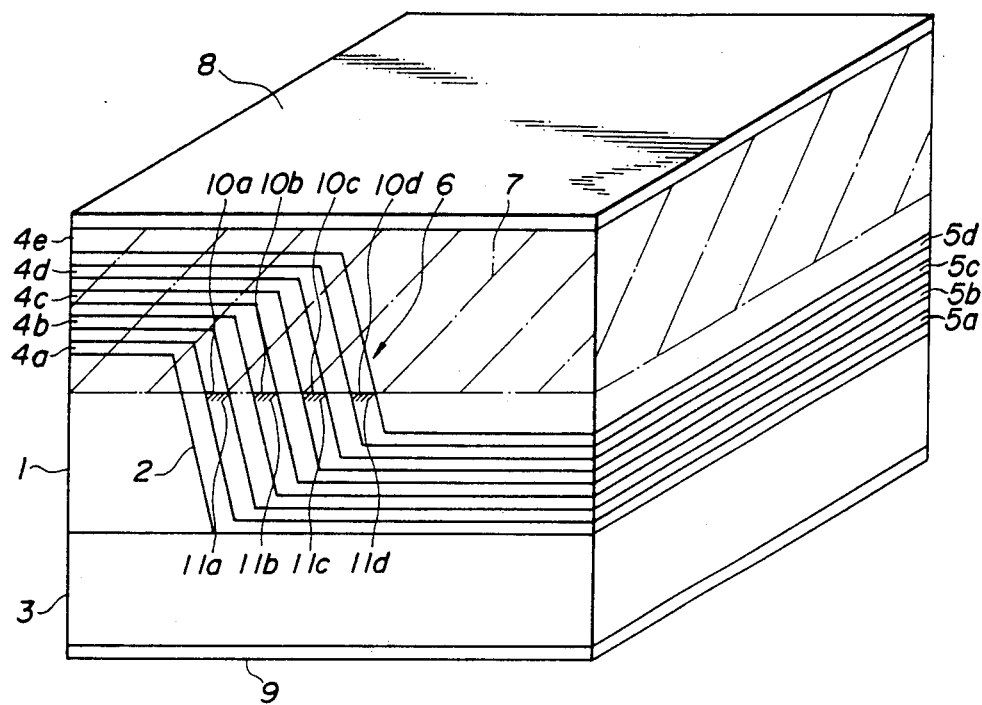
FIG. 3 is a schematic structural view showing a semiconductor laser which modifies the relation of refractive index and the method of biasing in the structure of the semiconductor shown in FIG. 1 to operate as a photobranch element.

FIG. 3 shows a semiconductor laser which can be used as a photobranch element. In this semiconductor laser, the same reference numerals as those used in the semiconductor laser shown in FIG. 1 are used. This is because of the fact that the modified portions comprise a change in function of confining light in the active layer and a change in method of setting a bias.

That is, this semiconductor laser is designated so that an optical wave is shifted from one to the other between the adjacent PN junction portions (10a, 10b), (10b, 10c) and (10c, 10d). More specifically, this can be achieved by creating a small differential in refractive index between the active layers 5a, 5b, 5c and 5d and the semiconductor layers 4b, 4c 4d disposed therebetween or by making these layers thinner. More effectively, both the procedures are simultaneously effected.

The method of setting bias is as described in the following explanation of operation.

In the semiconductor laser constructed as described above, a suitable forward bias is applied beforehand to the subject element to set each of the PN junction portions 10a, 10b, 10c and 10d to a value slightly smaller than the threshold value of laser oscillation. A laser beam is incident on one of the PN junction portions 10a, 10b, 10c and 10d, for example, PN junction portion 10b, from one crystal end. Then, a part of the laser beam incident on the PN junction portion 10b is propagated as well other PN junction portions 10a, 10c and 10d. At this time, the energy of the incident laser light is made to be equal to the energy required for laser oscillation by each of the PN junction portions 10a, 10b, 10c and 10d, and tehrefore, the PN junction portions 10a, 10b 10c and 10d provide laser oscillation by photoexcitation so that the laser beam is released from the crystal ends 11a, 11b, 11c and 11d.

Figure 4:
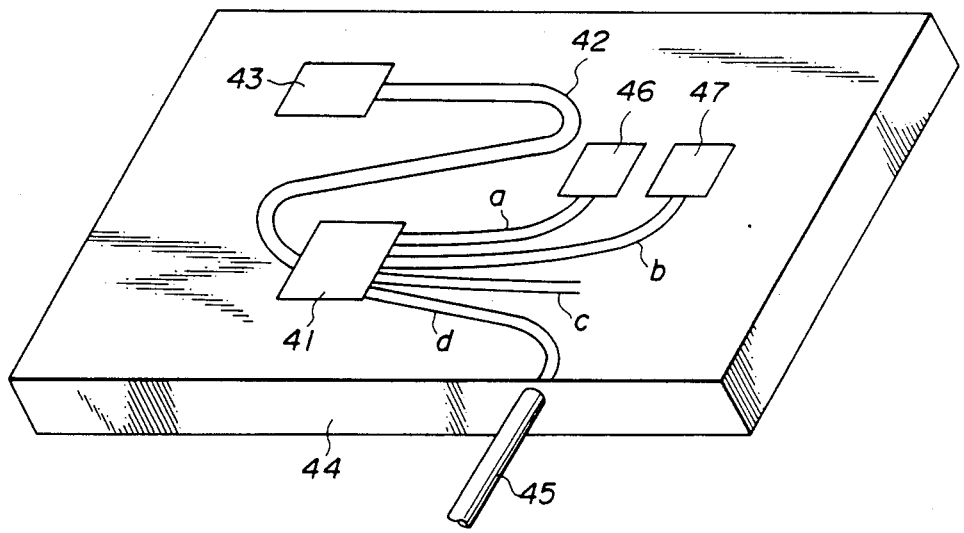
FIG. 4 is a schematic perspective view showing one example of application of the photobranching semiconductor laser shown in FIG. 3.

Thus, the semiconductor laser in this embodiment can be used as a photobranch element, and an example is shown in FIG. 4. In this figure, a photobranch element 41 comprising the semiconductor laser in this embodiment branches injection light of a semiconductor laser (light source) 43 guided by a photoguidewave passage 42 into four portions, the branched beams being guided by guidewave passage a, b, c and d, respectively. For example, one branched beam is injected into an optical fiber 45 connected to the side end of an optical IC substrate 44 whereas other branched beams are injected into various circuits (not shown) such as optical operational circuits 46, 47.

As many apparently widely different embodiments of this invention may be made without departing from the spirit and scope thereof, it is to be understood that the invention is not limited to the specific embodiment set forth herein.

What is claimed is:

1. A semiconductor laser, comprising
 a semiconductor crystal having a plurality of double heterojunctions formed by the lamination of active layers between first and second clad layers of a semiconductor of a first conductivity type and comprising step portions having step differential portions formed therebetween,
 wherein said step differential portions contain active regions formed by PN junctions which provide laser oscillation,
 said PN junctions being formed by an inverted layer made by diffusing a conductor of a second conductivity type over an area of the surface of the semiconductor crystal to said step differential portions.

2. The semiconductor laser of claim 1, further comprising carrier injection electrodes formed on both surfaces of said semiconductor crystal, at one of said electrodes comprising a plurality of electrodes formed as parallel stripes at predetermined intervals.

3. The semiconductor laser of claim 2, wherein
 the PN junction portions are oriented with respect to each other so that a photowave is shifted from one PN junction to an adjacent PN junction and
 the carrier injection electrodes have applied thereto a voltage for initially setting the PN junction portions to a state slightly below the laser oscillation threshold value, and further comprising
 a laser beam directed upon one of said PN junction portions from the outside of said semiconductor crystal to photoexcite the PN junction portions to create laser oscillation.

4. The semiconductor laser of claim 1, 2 or 3, wherein the semiconductor of first conductive type is a N-type semiconductor and wherein the conductive body of the second type is of a P-type.

5. The semiconductor laser of claim 4, wherein said P-type conductive body is zinc.

* * * * *